(12) United States Patent
Chu et al.

(10) Patent No.: US 10,806,052 B2
(45) Date of Patent: Oct. 13, 2020

(54) HEAT DISSIPATION MODULE, DISPLAY DEVICE AND ASSEMBLY METHOD

(71) Applicant: Wistron Corp., New Taipei (TW)

(72) Inventors: Chi-Wen Chu, New Taipei (TW); Yun An Chang, New Taipei (TW)

(73) Assignee: WISTRON CORP., New Taipei (TW)

( * ) Notice: Subject to any disclaimer, the term of this patent is extended or adjusted under 35 U.S.C. 154(b) by 0 days.

(21) Appl. No.: 16/351,876

(22) Filed: Mar. 13, 2019

(65) Prior Publication Data

US 2020/0154599 A1 May 14, 2020

(30) Foreign Application Priority Data

Nov. 9, 2018 (TW) .............................. 107139824 A

(51) Int. Cl.
| | |
|---|---|
| *H05K 7/20* | (2006.01) |
| *H05K 1/02* | (2006.01) |
| *H05K 1/18* | (2006.01) |
| *H05K 5/00* | (2006.01) |
| *G02F 1/1333* | (2006.01) |

(52) U.S. Cl.
CPC ..... *H05K 7/2039* (2013.01); *G02F 1/133308* (2013.01); *G02F 1/133385* (2013.01); *H05K 1/028* (2013.01); *H05K 1/181* (2013.01); *H05K 5/0017* (2013.01); *H05K 7/20963* (2013.01); *G02F 2001/13332* (2013.01); *G02F 2001/133314* (2013.01); *H05K 2201/056* (2013.01); *H05K 2201/066* (2013.01)

(58) Field of Classification Search
CPC .................................................. H05K 7/2039
See application file for complete search history.

(56) References Cited

U.S. PATENT DOCUMENTS

| | | | |
|---|---|---|---|
| 2018/0146572 A1* | 5/2018 | Park | H05K 1/028 |
| 2018/0163113 A1* | 6/2018 | Uta | H01L 23/3733 |
| 2019/0011760 A1* | 1/2019 | Wang | G02F 1/133 |

FOREIGN PATENT DOCUMENTS

| | | |
|---|---|---|
| CN | 105676502 A | 6/2016 |
| TW | 201833636 A | 9/2018 |

OTHER PUBLICATIONS

Taiwan Patent Office, "Office Action", dated Sep. 12, 2019, Taiwan.

* cited by examiner

*Primary Examiner* — Hung V Ngo
(74) *Attorney, Agent, or Firm* — Locke Lord LLP; Tim Tingkang Xia, Esq.

(57) ABSTRACT

The disclosure relates to a heat dissipation module, a display device having the same, and an assembly method thereof. Place the heat dissipation structure in between the chip of the COF (chip-on-film) and the thermal-conductive supporting component, heat generated by the chip of the COF can be absorbed by the heat dissipation structure and then be transferred to the thermal-conductive supporting component through the heat dissipation structure. As a result, the temperature of the chip is decreased, and the chip is avoided from operating at high temperature to deteriorate its performance and to result in thermal deformation or any other negative effects on the nearby components.

21 Claims, 14 Drawing Sheets

HEAT DISSIPATION MODULE, DISPLAY DEVICE AND ASSEMBLY METHOD

CROSS-REFERENCE TO RELATED APPLICATIONS

This non-provisional application claims priority under 35 U.S.C. § 119(a) on Patent Application No(s). 107139824 filed in Taiwan, R.O.C. on Nov. 9, 2018, the entire contents of which are hereby incorporated by reference.

TECHNICAL FIELD

The disclosure relates to a heat dissipation module, more particularly to a heat dissipation module including at least one heat dissipation structure, a display device having the same and an assembly method thereof.

BACKGROUND

In recent years, a display device having LCM (Liquid Crystal Display Module) becomes lighter and thinner. Also, more and more display devices start to use COF (Chip on film, COF) package in response to the growing demand for high resolution and narrower frames. The said COF package is a technique in which a flexible printed circuit film is used as a carrier of a chip bonded to the film. The COF is high throughput, high reliability and also lightweight and flexible.

SUMMARY

One embodiment of the disclosure provides a heat dissipation module, configured to absorb heat from a flexible substrate, including a thermal-conductive supporting component and at least one heat dissipation structure. One side of the at least one heat dissipation structure is in thermal contact with the thermal-conductive supporting component, another side of the at least one heat dissipation structure is configured to be in thermal contact with the flexible substrate so as to force the flexible substrate to be deformed.

One embodiment of the disclosure provides a display device including a display module, at least one COF (chip-on-film) and a heat dissipation module. The COF (chip-on-film) includes a flexible substrate connected to the display module. The heat dissipation module includes a thermal-conductive supporting component and at least one heat dissipation structure. The thermal-conductive supporting component is fixed to the display module. One side of the at least one heat dissipation structure is in thermal contact with the thermal-conductive supporting component, and another side of the at least one heat dissipation structure is in thermal contact with the flexible substrate so as to force the flexible substrate to be deformed.

One embodiment of the disclosure provides an assembly method, including the following steps: providing a display module that is connected to at least one COF, wherein the at least one COF comprises a flexible substrate electrically connected to the display module; disposing an electrical insulation positioning sheet on a thermal-conductive supporting component so that part of a bearing surface of the thermal-conductive supporting component is exposed from at least one notch of the electrical insulation positioning sheet; disposing a side of at least one heat dissipation structure of a heat dissipation module through the at least one notch so that the at least one heat dissipation structure is in thermal contact with the bearing surface; and moving the thermal-conductive supporting component and the at least one heat dissipation structure of the heat dissipation module toward the display module so as to install the thermal-conductive supporting component to the display module and to thermally contact another side of the at least one heat dissipation structure to the flexible substrate and thus deforming the flexible substrate.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Figure 1:
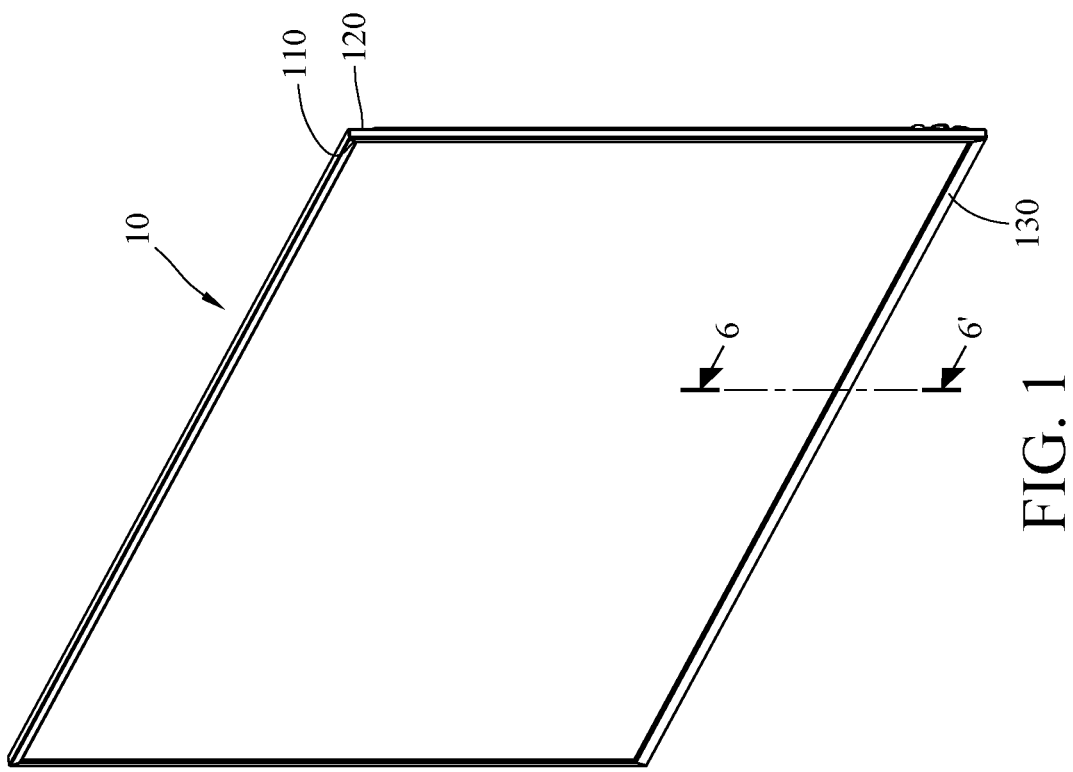
FIG. 1 is a perspective view of a display device according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known main structures and devices are schematically shown in order to simplify the drawing.

In addition, the terms used in the following paragraphs should be read on the meaning commonly used in the related fields and will not be overly explained, unless the terms have a specific meaning in the present disclosure. Furthermore, in order to simplify the drawings, some conventional structures and components are drawn in a simplified manner to keep the drawings clean. And the size, ratio, and angle of the components in the drawings of the present disclosure may be exaggerated for illustrative purposes.

Further, in the following, it may use terms, such as "substantially", "approximately" or "about"; when these terms are used in combination with size, concentration, temperature or other physical or chemical properties or characteristics, they are used to express that, the deviation existing in the upper and/or lower limits of the range of these properties or characteristics or the acceptable tolerances caused by the manufacturing tolerances or analysis process, would still able to achieve the desired effect.

Figure 2:
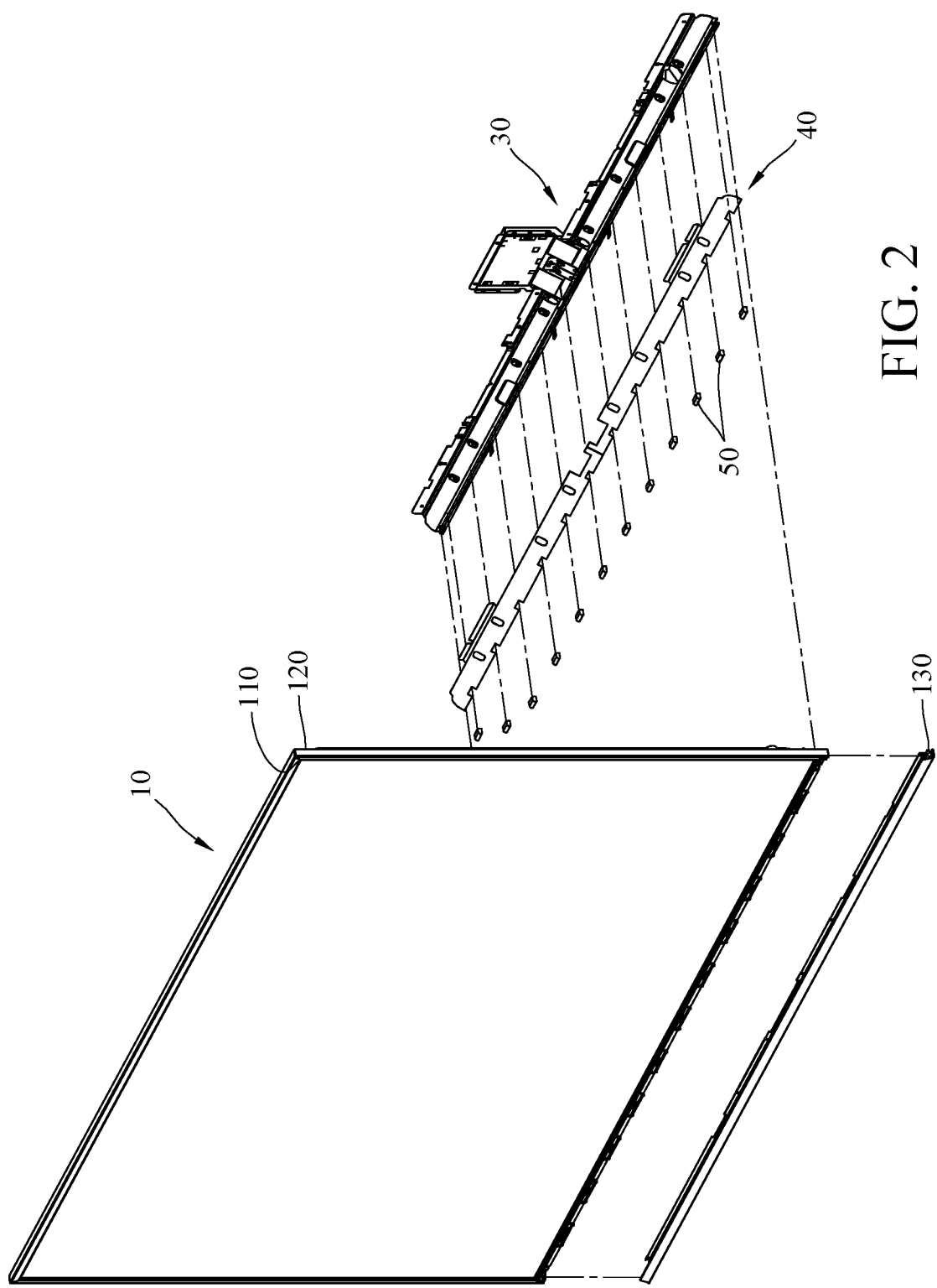
FIG. 2 is an exploded view of the display device in FIG. 1.
Figure 3:
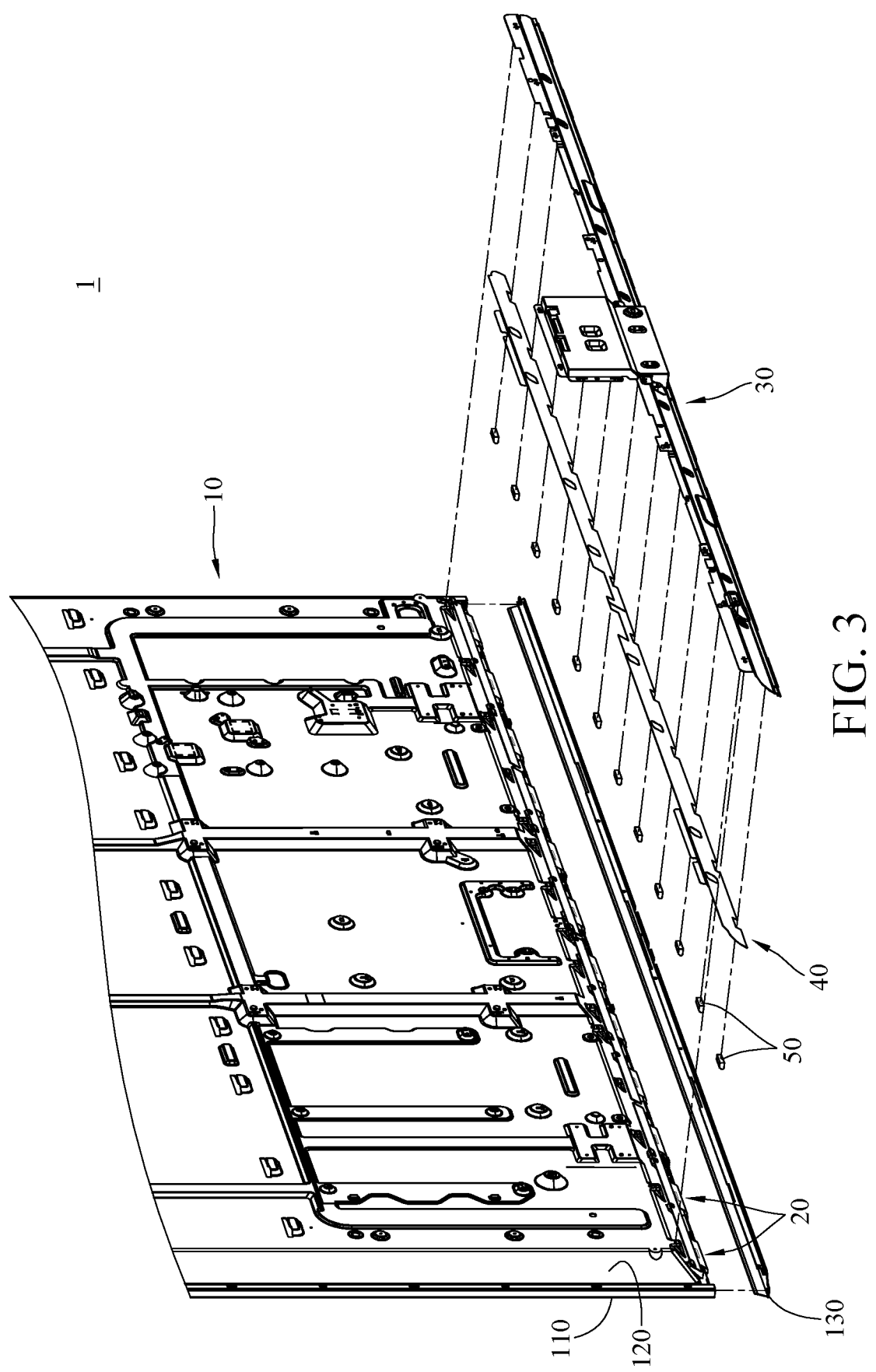
FIG. 3 is a partially-enlarged exploded view of the display device in FIG. 1 taken from different view angles.
Figure 6:
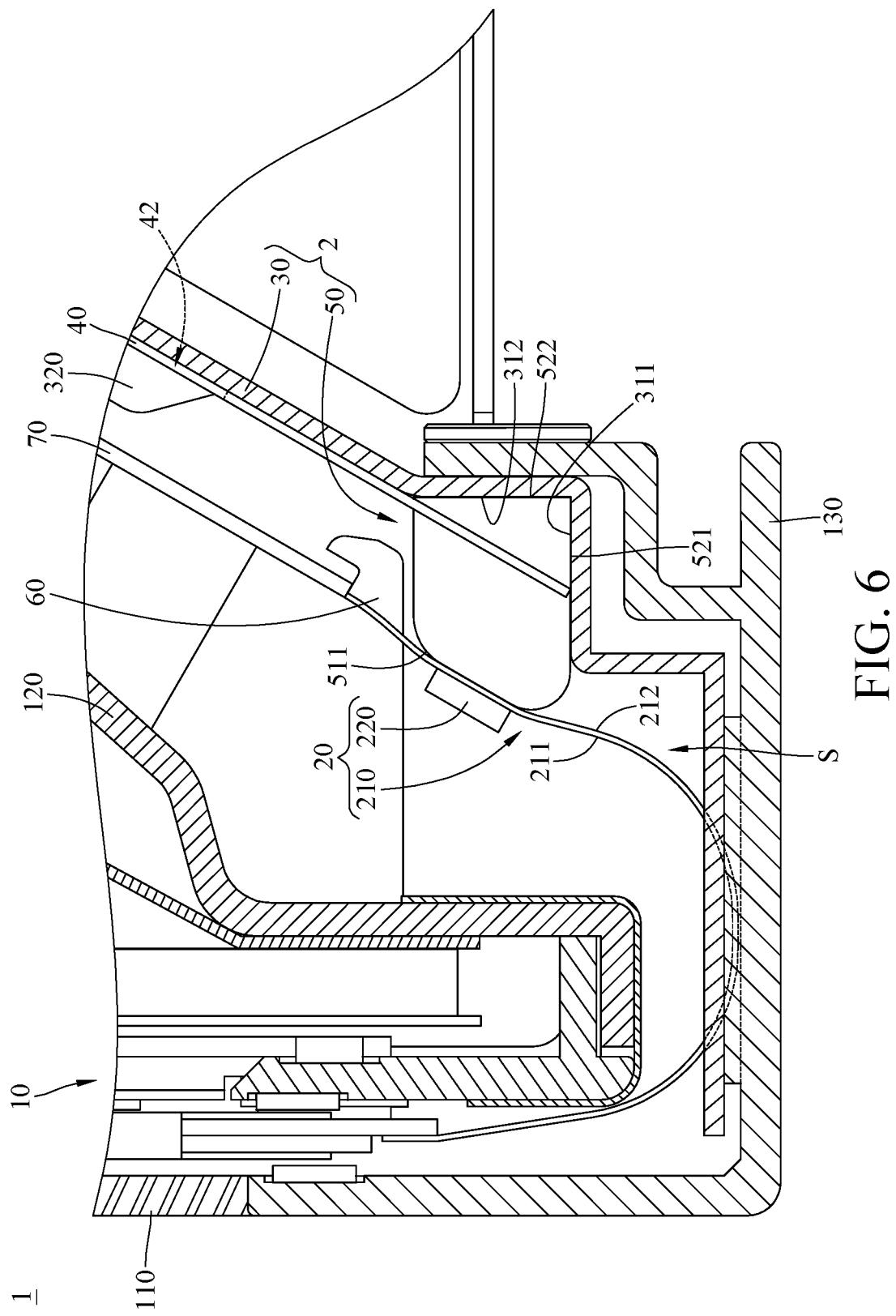
FIG. 6 is a partially-enlarged cross-sectional view of the display device in FIG. 1 taken along line 6-6'.

Firstly, please refer to FIG. 1-3, FIG. 1 is a perspective view of a display device according to a first embodiment of the disclosure, FIG. 2 is an exploded view of the display device in FIG. 1, and FIG. 3 is a partially-enlarged exploded view of the display device in FIG. 1 taken from different view angles. This embodiment provides a display device 1 including a display module 10, a plurality of COFs (Chip-on-film) 20, a thermal-conductive supporting component 30, an electrical insulation positioning sheet 40 and a plurality of heat dissipation structures 50. In this embodiment, the thermal-conductive supporting component 30 and the heat dissipation structure 50 can be assembled into a heat dissipation module 2 (as shown in FIG. 6), and their detail descriptions will be provided later.

The display module 10 may be, but not limited to, a liquid crystal display module (LCM), and may include a front frame 110 and a rear casing 120 that can be assembled together. The front frame 110 is located at the front side of the display module 10, and the rear casing 120 is located at the rear side of the display module 10 so as to accommodate, for example, a display panel, backlight module, light source, light guiding plate, and other components for achieving display function (all not shown), but the disclosure is not limited by the components accommodated in the display module 10. The "front side" may be interpreted as the side of the display module 10 that faces the viewer when the display module 10 is in use, and the "rear side" may be interpreted as the side of the display module 10 that faces away from the viewer when the display module 10 is in use.

Each of the COFs 20 is partially located at the rear side of the display module 10, and another part of the COF 20 across the bottom side of the display module 10. The "bottom side" may be interpreted as the side of the display module 10 that faces the bearing plane (e.g., a table). The electrical insulation positioning sheet 40 and the heat dissipation structure 50 are both disposed on the thermal-conductive supporting component 30 and can be assembled to the rear side of the display module 10 with the thermal-conductive supporting component 30 so as to be located close to the bottom side. In this embodiment, the display module 10 further includes a bottom cover 130, and the bottom cover 130 can be installed to the bottom side of the display module 10. And the bottom cover 130 can be screwed to the thermal-conductive supporting component 30, but the disclosure is not limited by the bottom cover 130.

Figure 4:
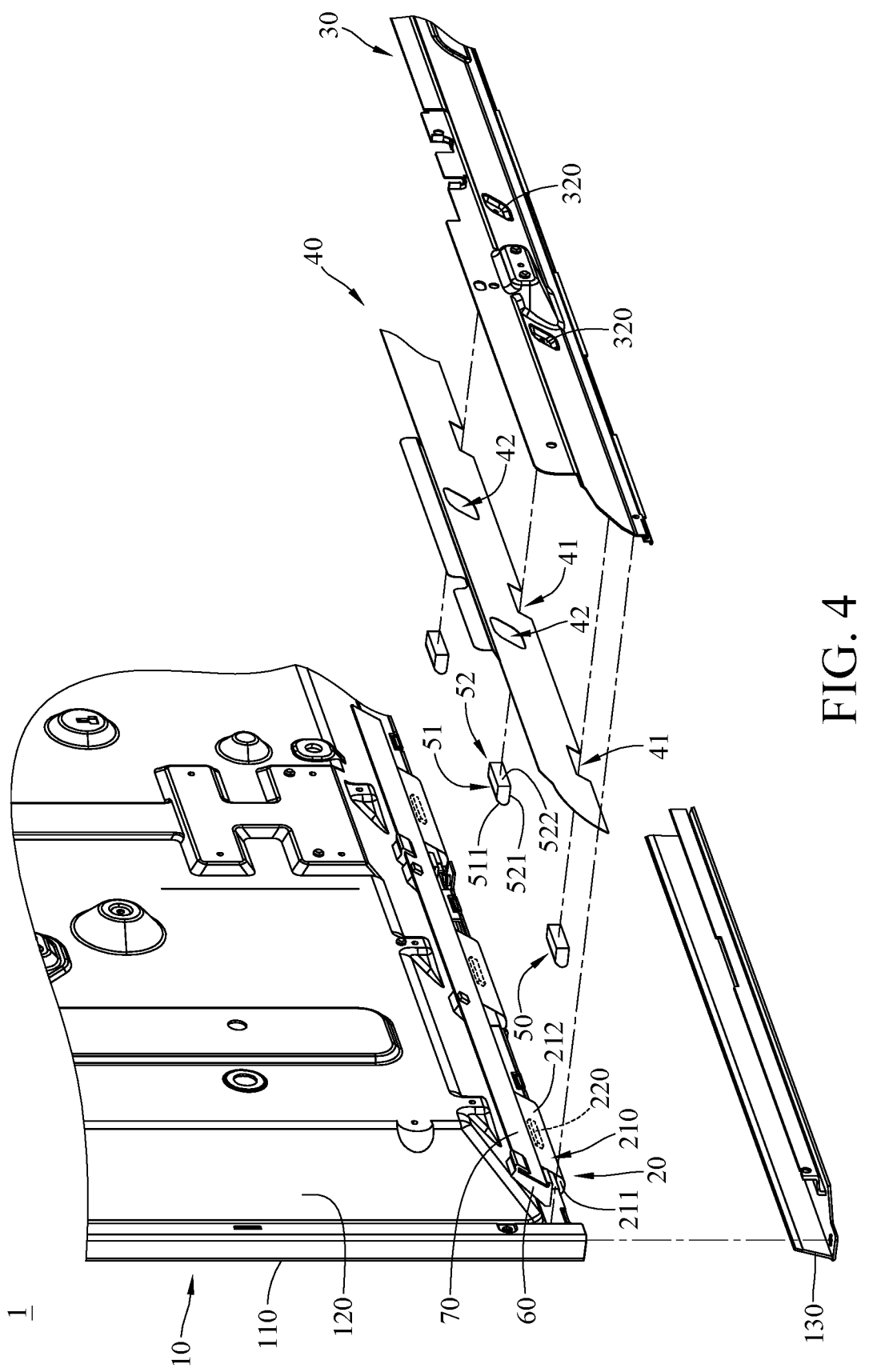
FIG. 4 and FIG. 5 respectively are partially-enlarged exploded views of the display device according to the first embodiment of the disclosure taken from different view angles.

The detail descriptions of the COF 20, the thermal-conductive supporting component 30, the electrical insulation positioning sheet 40, and the heat dissipation structure 50 will be provided hereinafter. Please further refer to FIGS. 4-6, FIG. 4 and FIG. 5 respectively are partially-enlarged exploded views of the display device 1 taken from different view angles, and FIG. 6 is a partially-enlarged cross-sectional view of the display device 1 in FIG. 1 taken along line 6-6'.

In this embodiment, the display device 1 further includes a plurality of holding components 60 and a printed circuit board (PCB) 70. The printed circuit board 70 can be simply called circuit board 70. The holding components 60 are disposed on the rear casing 120 of the display module 10. In more detail, the holding components 60 are arranged along an extension direction of the bottom side of the display module 10 and spaced apart from each other. The holding component 60 may be, but not be limited to, a clip structure or hook configured to hold the circuit board 70 in the desired position on the rear casing 120 of the display module 10. Note that the holding component 60 is optional, and its configuration and quantity is not restricted and can be modified according to the requirement for holding the circuit board 70. In another embodiment, the quantity of the holding components 60 may be increased or decreased; in yet another embodiment, the holding component 60 may be replaced by adhesion so that the circuit board 70 can be adhered to the rear casing 120 of the display module 10.

Each COF 20 includes a flexible printed circuit film (can be simply called flexible film or flexible substrate) 210 and a chip 220. In this embodiment, the flexible substrate 210 is made of, but not intended to be limited by, flexible materials, such that the flexible substrate 210 can be deformed by applying force or being pushed by an external object. For example, in this embodiment, the flexible substrate 210 is deformed in a curved manner so as to cross the bottom side of the display module 10. Note that the flexible substrate 210 can return to its original shape when the force or external object is removed. In addition, there might be traces or one or more passive components on the flexible substrate 210 (not shown), but the disclosure is not limited thereto. In addition, the aforementioned chip 220 can be considered as a heat source since it will generate heat while being activated, and the heat may be transferred to the flexible substrate 210 so the flexible substrate 210 may also be considered as a heat source; thus the chip 220 and the flexible substrate 210 may be also called heat sources in the following paragraphs.

In more detail, one end of the flexible substrate 210 is electrically connected to the front side of the display module 10 so as to electrically connect to one or more electrical devices in the display module 10 (e.g., a display panel), and another end of the flexible substrate 210 is electrically connected to the circuit board 70. Therefore, the flexible substrate 210 allows the circuit board 70 to electrically connect to the display module 10.

In addition, the flexible substrate 210 has a first surface 211 and a second surface 212 opposite each other. As shown in the figure, the first surface 211 of the flexible substrate 210 faces the display module 10, and the second surface 212 of the flexible substrate 210 faces away from the display module 10. The chips 220 are installed on the first surface 211 of the flexible substrate 210; that is, in this embodiment, the chips 220 are installed on the surface of the flexible substrate 210 facing the display module 10. Therefore, the signal transmitted to the circuit board 70 can be transmitted to the chips 220 via the flexible substrate 210, and then the signal can be transmitted to the display module 10 via the flexible substrate 210. However, the disclosure is not limited to the relationship between the display module 10 and the chips 220.

The thermal-conductive supporting component 30 can be fixed to the rear casing 120 of the display module 10 to support the display module 10 and to cover the COFs 20, part of the rear casing 120, the holding components 60 on the rear casing 120, and the circuit board 70. In this embodiment, the thermal-conductive supporting component 30 can be fixed to the rear casing 120 via a plurality of screws (not shown), but the disclosure is not limited by how the thermal-conductive supporting component 30 is fixed to the display module 10.

The thermal-conductive supporting component 30 may be made of, but not intended to be limited by, any metal that has highly thermal conductivity. For example, in this embodiment, the thermal-conductive supporting component 30 may be made of aluminum (Al), stainless steel or steel, electrogalvanized, cold rolled, coil (SECC) coated with zinc with anti-corrosion, anti-acid, and dustproof. Note that the disclosure is not limited by the material of the thermal-conductive supporting component 30.

The electrical insulation positioning sheet 40 may be disposed on a side of the thermal-conductive supporting component 30 facing the display module 10, such that part of the electrical insulation positioning sheet 40 is located between the circuit board 70 and the thermal-conductive supporting component 30. The electrical insulation positioning sheet 40 is made of, but not intended to be limited by, electrical insulation material such as polyethylene terephthalate (PET). For example, in this embodiment, the electrical insulation positioning sheet 40 may be made of Mylar which is a well-known film manufactured by Dupont Inc. Therefore, the electrical insulation positioning sheet 40 can prevent the metallic thermal-conductive supporting component 30 from contacting the circuit board 70 to cause a short-circuit, and the electrical insulation positioning sheet 40 can protect the circuit board 70 and the electrical components thereon from hitting the thermal-conductive supporting component 30. However, the disclosure is not limited by the material of the electrical insulation positioning sheet 40.

In addition, the electrical insulation positioning sheet 40 has a plurality of notches 41 and a plurality of positioning holes 42. The notch 41 are arranged along an edge of the electrical insulation positioning sheet 40 and spaced apart from each other, and the positioning holes 42 are arranged in a direction the same as that of the notches 41 and are spaced apart from each other. In this embodiment, the positioning holes 42 are not aligned with the notches 41, but the disclosure is not limited thereto. For example, in other embodiments, the positioning holes 42 may be respectively aligned with the notches 41.

The thermal-conductive supporting component 30 has a plurality of positioning portions 320 respectively corresponding to the positioning holes 42 of the electrical insulation positioning sheet 40 and located at a side of the thermal-conductive supporting component 30 facing the display module 10. Thus, it is understood that the positioning portions 320 are arranged along the edge of the thermal-conductive supporting component 30 and spaced apart from each other. When the electrical insulation positioning sheet 40 is disposed on the thermal-conductive supporting component 30, the positioning portions 320 of the thermal-conductive supporting component 30 are respectively disposed through the positioning holes 42 of the electrical insulation positioning sheet 40, thereby fixing the electrical insulation positioning sheet 40 to the thermal-conductive supporting component 30. Note that the quantities of the positioning holes 42 of the electrical insulation positioning sheet 40 and the positioning portions 320 of the thermal-conductive supporting component 30 may be adjusted according to actual requirements, and the disclosure is not limited thereto. In some embodiments, the electrical insulation positioning sheet may have no positioning hole, and the thermal-conductive supporting component may have no positioning portion; in such a case, the electrical insulation positioning sheet may be adhered to the thermal-conductive supporting component.

Additionally, when the electrical insulation positioning sheet 40 is disposed on the thermal-conductive supporting component 30, part of the thermal-conductive supporting component 30 is exposed from the notches 41 of the electrical insulation positioning sheet 40, such that the heat dissipation structures 50 are allowed to be disposed through these notches 41 to be disposed on the side of the thermal-conductive supporting component 30 facing the display module 10. When the heat dissipation structures 50 are disposed on the thermal-conductive supporting component 30, the heat dissipation structures 50 and the thermal-conductive supporting component 30 together form a heat dissipation module 2. At this moment, the notches 41 position the heat dissipation structures 50, such that the heat dissipation structures 50 can be maintained at the desired positions. In short, the electrical insulation positioning sheet 40 is able to position the heat dissipation structure 50.

Further, each heat dissipation structure 50 has a first side 51 and a second side 52 opposite each other. The first side 51 faces the display module 10, and the second side 52 faces away from the display module 10. In this embodiment, each heat dissipation structure 50 further has a first contact surface 511, a second contact surface 521, and a third contact surface 522. The first contact surface 511 is located at the first side 51, and the second contact surface 521 and the third contact surface 522 are located at the second side 52. In more detail, in this embodiment, the first contact surface 511, the second contact surface 521, and the third contact surface 522 are not parallel to one another, and the second contact surface 521 and the third contact surface 522 are substantially perpendicular to each other, but the disclosure is not limited thereto. The shapes and relationships among the first contact surface 511, the second contact surface 521 and the third contact surface 522 may be modified based on the contour of the heat dissipation structure 50. Furthermore, in this embodiment, the side of the thermal-conductive supporting component 30 facing the display module 10 (i.e., the side of the thermal-conductive supporting component 30 facing the heat dissipation structure 50) has a first bearing surface 311 and a second bearing surface 312 substantially perpendicular to each other, but the disclosure is not limited thereto. The shapes and relationships of the first bearing surface 311 and the second bearing surface 312 may be modified based on the design of the thermal-conductive supporting component 30 or the shape of the heat dissipation structure 50. For example, in other embodiments, the side of the thermal-conductive supporting component facing the heat dissipation structure may only have one bearing surface.

In this embodiment, the shape formed by the second contact surface 521 and the third contact surface 522 of the heat dissipation structure 50 substantially matches the shape formed by the first bearing surface 311 and the second bearing surface 312 of the thermal-conductive supporting component 30. Therefore, when the heat dissipation structure 50 is disposed through the notch 41 of the electrical insulation positioning sheet 40, its second contact surface 521 and third contact surface 522 are respectively in thermal contact with the first bearing surface 311 and the second bearing surface 312 of the thermal-conductive supporting component 30, thereby forming the heat dissipation module 2.

In addition, in this embodiment, the heat dissipation structure 50 is made of a single piece, and may be made of, but not intended to be limited by, high thermal conductivity material. For example, the material of the heat dissipation structure 50 may include silicone resin and aluminum oxide. The said silicone resin has various properties such as high heat resistance, electrical insulation, waterproof, flame retardants, and is widely used in the electrical/electronic industry; and the said aluminum oxide is the one of the most abundant element on Earth, and has various properties such as high temperature resistance, high corrosion resistance and high heat transfer coefficient. In the heat dissipation structure 50 in this embodiment, the percentage of silicone resin in the heat dissipation structure may be approximately 30±5%, and the percentage of aluminum oxide in the heat dissipation structure is approximately 70±5%, such that the heat dissipation structure 50 can be highly thermally conductive, self-adhesive, not electrically conductive, flexible, and soft in texture. The said "flexible" implies that the heat dissipation structure 50 can be deformed by applying force but can return to its original shape when the force is removed. The said "soft in texture" implies that the heat dissipation structure 50 has soft texture; in this embodiment, the heat dissipation structure 50 is softer than conventional metallic heat dissipation structure and heat source (e.g., the flexible substrate 210 or chip 220); that is, the hardness of the heat dissipation structure 50 is at least lower than or equal to that of the conventional metallic heat dissipation structure and heat source (e.g., the flexible substrate 210 or chip 220). And the heat dissipation structure 50 has a certain degree of compressibility, such that its volume could be changed when being compressed. Accordingly, when the flexible substrate 210 is in contact with the heat dissipation structure 50, the flexible substrate 210 does not be easily scratched or bumped by the heat dissipation structure 50.

In addition, by the composition and materials of the heat dissipation structure 50, the roughness of the heat dissipation structure 50 can be very low and thus not easily scratching the heat source (e.g., the flexible substrate 210 or chip 220). However, the disclosure is not limited to the composition and materials of the heat dissipation structure 50. In some other embodiments, any proper material that can improve the thermal conductivity, self-adhesion or insulation or can adjust the softness/hardness of the heat dissipation structure 50 may be added into the heat dissipation structure 50. Also, it is understood that the material of the heat dissipation structure 50 is cheaper than that of the conventional metallic heat dissipation structure; thus, the heat dissipation structure 50 is also cost-effective.

Therefore, when the heat dissipation structure 50 is disposed through the notch 41 of the electrical insulation positioning sheet 40 and its second contact surface 521 and third contact surface 522 are respectively in thermal contact with the first bearing surface 311 and the second bearing surface 312 of the thermal-conductive supporting component 30, the heat dissipation structure 50 can be directly firmly fixed on the thermal-conductive supporting component 30 by its own property such as self-adhesion; that is, the heat dissipation structure 50 can be fixed in position without additional adhesive. In short, the assembly process of the heat dissipation module 2 is completed by directly placing the heat dissipation structure 50 on the thermal-conductive supporting component 30. This simplifies the assembly process and decreases the manufacturing cost.

Additionally, the heat dissipation structure 50 adhered to the thermal-conductive supporting component 30 and underwent a vibration test with an amplitude of 3 millimeters at a frequency of 300 times/min for a total of 10000 times in total by a vibration tester HY-100B, the heat dissipation structure 50 is still firmly fixed on the thermal-conductive supporting component 30. The result shows that the self-adhesion of the heat dissipation structure 50 is highly reliable.

However, in some embodiments, the material of the heat dissipation structure 50 may not be self-adhesive; in such a case, the second contact surface 521 and the third contact surface 522 of the heat dissipation structure 50 may be fixed to the thermal-conductive supporting component 30 via thermal adhesive. That is, in other embodiments, the heat dissipation structure 50 is allowed to be fixed to the thermal-conductive supporting component 30 via thermal adhesive.

Accordingly, when the thermal-conductive supporting component 30 is installed on the rear casing 120 of the display module 10 (i.e., when the heat dissipation module 2 is installed on the rear casing 120 of the display module 10), the first contact surface 511 of the heat dissipation structure 50 is in thermal contact with the second surface 212 of the flexible substrate 210 (i.e., the first contact surface 511 of the heat dissipation structure 50 is in thermal contact with the surface of the flexible substrate 210 facing away from the chip 220), such that the flexible substrate 210 is clamped by the heat dissipation structure 50 and the chip 220 and part of the flexible substrate 210 is located between the heat dissipation structure 50 and the chip 220. At this moment, the heat dissipation structure 50 is able to effectively absorb heat generated by the chip 220 of the COF 20. Note that the area of the first contact surface 511 may be determined and can be modified according to, for example, the size of the chip 220 of the COF 20, and the disclosure is not limited thereto.

It is understood that the actual size of the heat dissipation structure 50 may be slightly different from the determined size due to manufacturing tolerances. Moreover, in this or other embodiments, the length of the heat dissipation structure 50 may be slightly larger than the distance between the COF 20 and the thermal-conductive supporting component 30, such that, when the heat dissipation module 2 is installed on the rear casing 120 of the display module 10, the heat dissipation structure 50 applies a force on the second surface 212 of the flexible substrate 210 to deform the flexible substrate 210; that is, when the heat dissipation module 2 is installed, the first contact surface 511 of the heat dissipation structure 50 can not only thermally contact but also push the heat source (i.e., the chip 220 or flexible substrate 210 in this embodiment). This ensures that there is no gap between the first contact surface 511 of the heat dissipation structure 50 and the COF 20 so as to enhance the thermal contact between the heat dissipation structure 50 and the COF 20.

In addition, in this embodiment, there may be an anti-stick coating (not shown) coated on the first contact surface 511 of the heat dissipation structure 50 to prevent the heat dissipation structure 50 from sticking to the heat source (i.e., the chip 220 or flexible substrate 210 in this embodiment). The material of the said anti-stick coating may include organic germanium compound consisted of hydrogen silicone oil (CAS: 63148-57-2) of approximately 2-10 wt % and vinyl silicone oil (CAS: 68083-19-2) of approximately 90-98 wt %. The anti-stick coating also can prevent dust or unwanted particles from sticking on the first contact surface 511 so as to prevent scratching on the flexible substrate 210, and allows the heat dissipation structure 50 to repeatedly contact the flexible substrate 210. Further, the anti-stick coating has very low thermal resistance thus it substantially will not have negative effect on heat transfer.

Also, as discussed above, the heat dissipation structure 50 is electrical insulation and thus preventing electro static discharge (ESD) or electromagnetic interference (EMI) with peripheral electrical components, such as COF 20 and circuit board 70.

Figure 7:
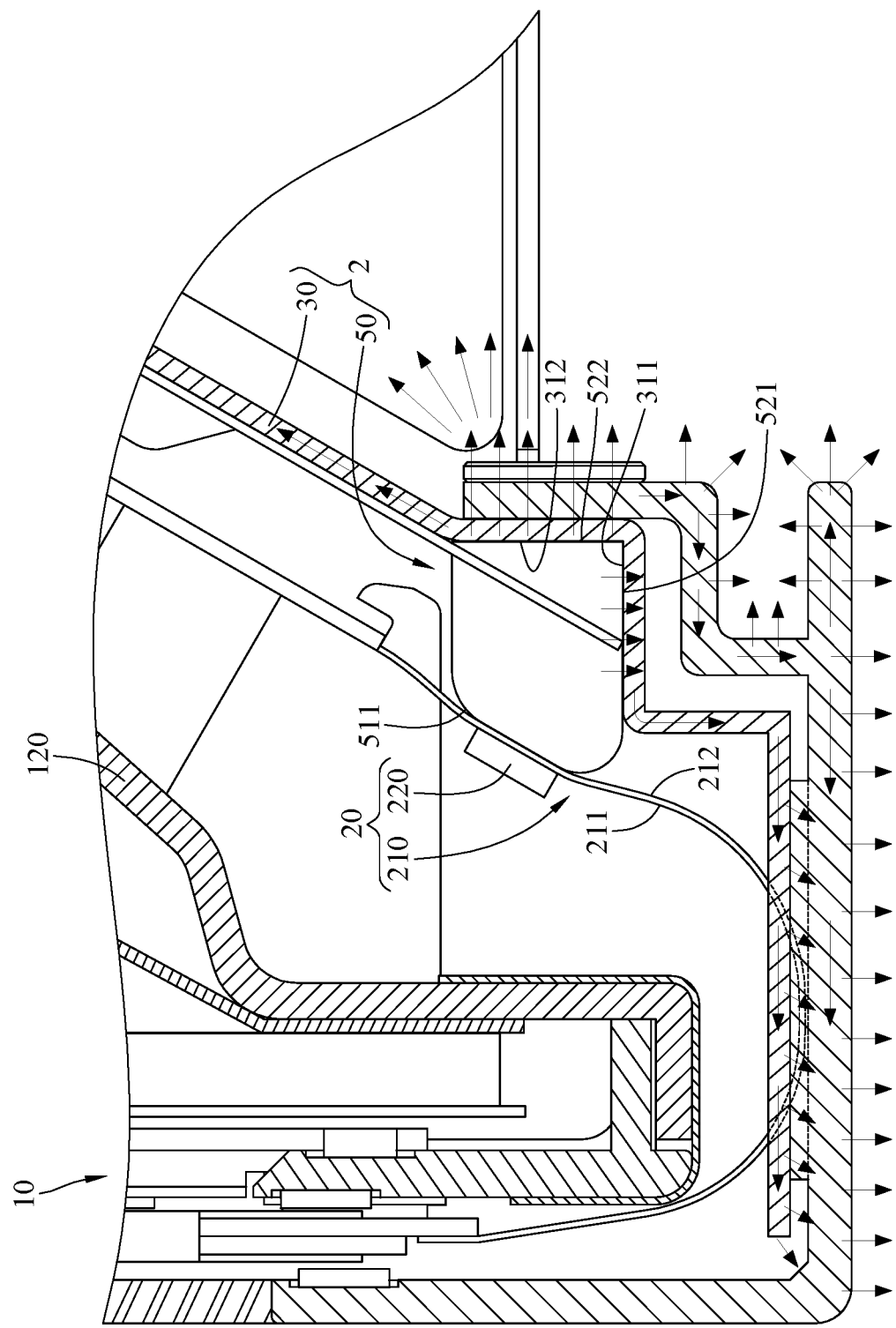
FIG. 7 shows the heat conduction in the display device in FIG. 6.

Then, please further refer to FIG. 7 to see the heat conduction in the display device 1. In FIG. 7, the arrows are used to indicate the conduction of thermal energy. As shown in the figure, when the heat dissipation module 2 is installed on the rear casing 120 of the display module 10 to let the first contact surface 511 of the heat dissipation structure 50 to thermally contact the second surface 212 of the flexible substrate 210, the heat generated by the chip 220 is conducted to the flexible substrate 210 and then absorbed by the heat dissipation structure 50, then the heat in the heat dissipation structure 50 is transferred to the thermal-conductive supporting component 30 via the second contact surface 521, the third contact surface 522, the first bearing surface 311 and the second bearing surface 312, and then the heat is transferred to other metal components that is connected to the thermal-conductive supporting component 30. Additionally, as discussed above, the heat dissipation structure 50 can push and deform the flexible substrate 210 to enhance the thermal contact with the flexible substrate 210. However, the disclosure is not limited by the amount of deformation of the flexible substrate 210 caused by the heat dissipation structure 50; for example, in other embodiments, the heat dissipation structure may be slightly in thermal contact with the flexible substrate without deforming the flexible substrate.

According to the temperature records, after the display device 1 had been operated for one hour at a room temperature of approximately 25 degrees Celsius, due to the cooperation of the heat dissipation structure 50 and the thermal-conductive supporting component 30 (i.e., the heat dissipation module 2), the chip 220 is still maintained at a temperature of approximately 75 degrees Celsius (way below the upper limit temperature (e.g., 87.5 degrees Celsius) of the optimal operation of the chip of the COF).

Moreover, regarding the manufacturing of the heat dissipation structure 50, the first step may be to pour the aforementioned materials with the aforementioned proportion into a mold, then is underwent an extrusion process to extrude one or more elongated objects, and then the elongated object is cut into plural heat dissipation structures according to the size requirement. These processes can be performed by automatic apparatus, such that the heat dissipation structure 50 is mass-productive and can ensure the heat dissipation effect.

Further, the disclosure is not limited by the shape of the heat dissipation structure 50. In fact, the shape of the heat dissipation structure 50 may be modified to match the shape of the regular or irregular space (e.g., a space S in FIG. 6) that is formed between the heat source (e.g., the COF 20) and the nearby components (e.g., the thermal-conductive supporting component 30). That is, through the aforementioned specification and manufacturing process of the heat dissipation structure, the heat dissipation structure is easily be modified to fit any internal space. Similarly, the width of the heat dissipation structure 50 in the extension direction of the thermal-conductive supporting component 30 (or the extension direction of the electrical insulation positioning sheet 40) may be changed according to the actual requirements, and the disclosure is not limited thereto.

In addition, the quantity of the COF 20 is not restricted. For example, in some other embodiments, the display device may only have one COF 20; in such a case, the quantities of the heat dissipation structure 50 and the notch 41 on the electrical insulation positioning sheet 40 may also be changed accordingly. In the case that the display device only has one COF 20, the quantities of the heat dissipation structure 50 and notch 41 may each be one. In the case that the display device has a plurality of COFs 20, the heat dissipation structure 50 may be replaced with one longer heat dissipation structure that can thermally contact all of the COFs 20 at the same time; in such a case, the quantity of the notch may still be one. In addition, in other embodiments, the display device may not have the electrical insulation positioning sheet 40; in such a case, the locations for the heat dissipation structures on the thermal-conductive supporting component may be pre-marked by marker; alternatively, the thermal-conductive supporting component may have recesses for positioning the heat dissipation structures.

Figure 8:
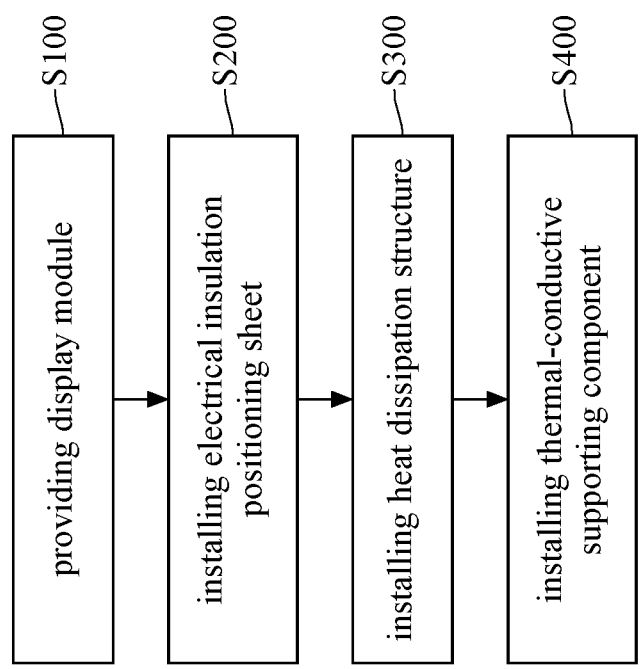
FIG. 8 is a flowchart showing an assembly method of the display device in FIG. 1.

Then, please refer to FIG. 8 to see the assembly method of the display device 1. The assembly method may include a step (S100) of providing the display module, a step (S200) of installing the electrical insulation positioning sheet, a step (S300) of installing the heat dissipation structure, and a step (S400) of installing the thermal-conductive supporting component.

Figure 9:
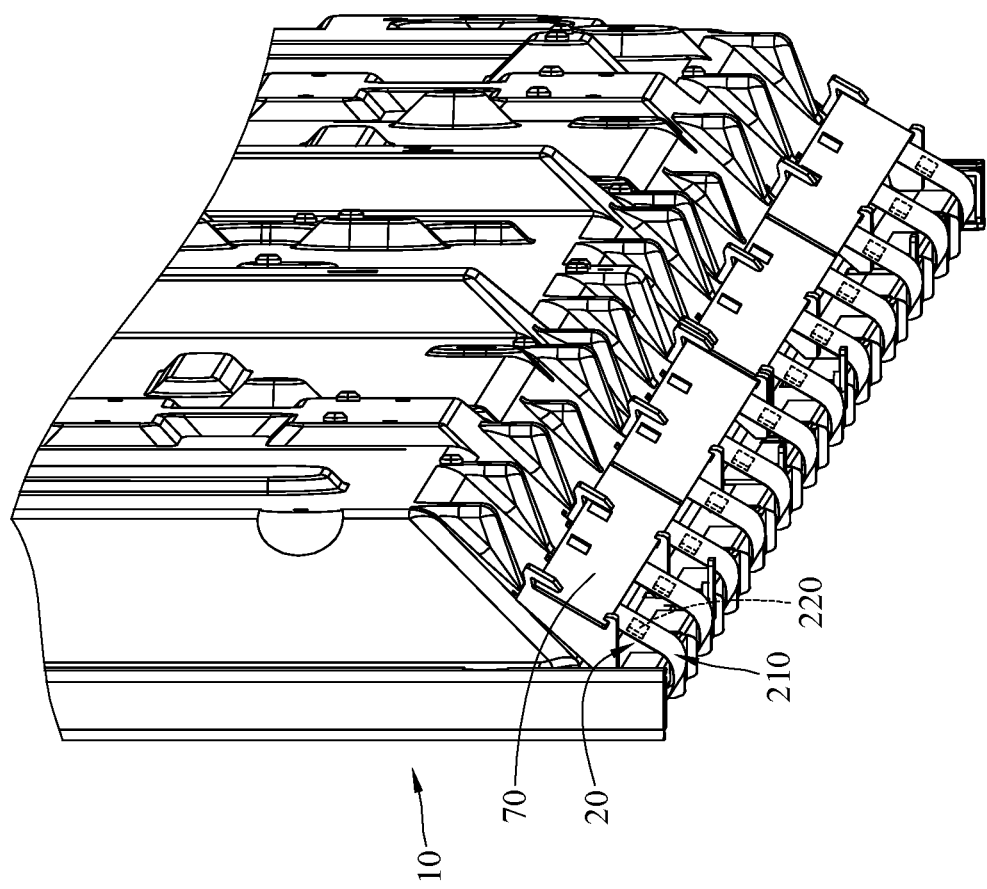
FIG. 9 is a partial perspective view of the display module showing that a step of providing the display module.

In detail, as shown in FIG. 8 and FIG. 9, the step S100 is to provide the display module 10 having the COF 20, wherein the COF 20 includes the flexible substrate 210 electrically connected to the display module 10 and the chip 220 disposed on the flexible substrate 210.

Figure 10:
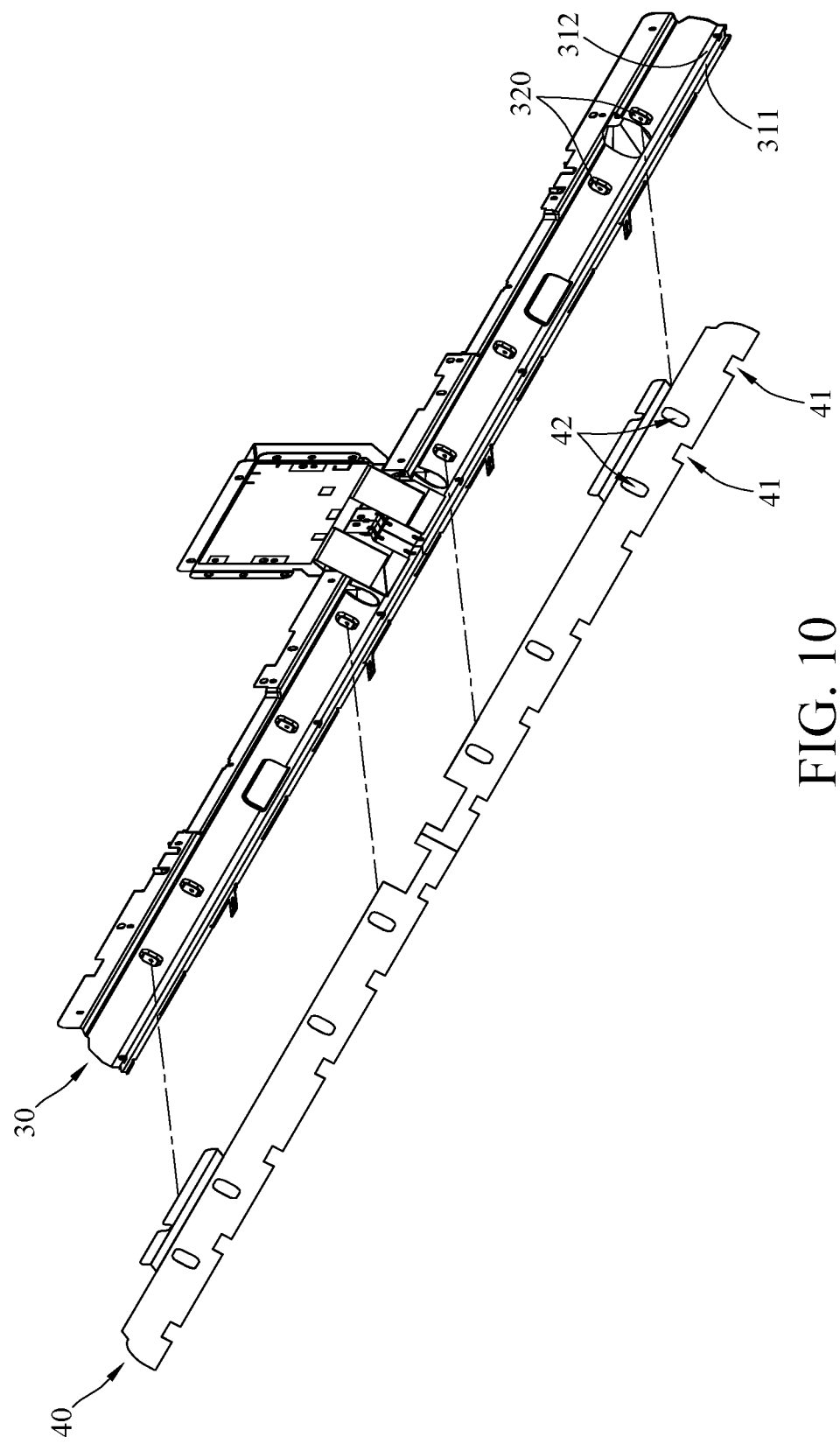
FIG. 10 shows that a step of installing the electrical insulation positioning sheet.

Then, as shown in FIG. 8 and FIG. 10, the step S200 is to install the electrical insulation positioning sheet 40 on the thermal-conductive supporting component 30. Part of the first bearing surface 311 and second bearing surface 312 of the thermal-conductive supporting component 30 is exposed from the notches 41 of the electrical insulation positioning sheet 40. In addition, the step S200 may further include a step of respectively disposing the positioning portions 320 of the thermal-conductive supporting component 30 through the positioning holes 42 of the electrical insulation positioning sheet 40.

Figure 11:
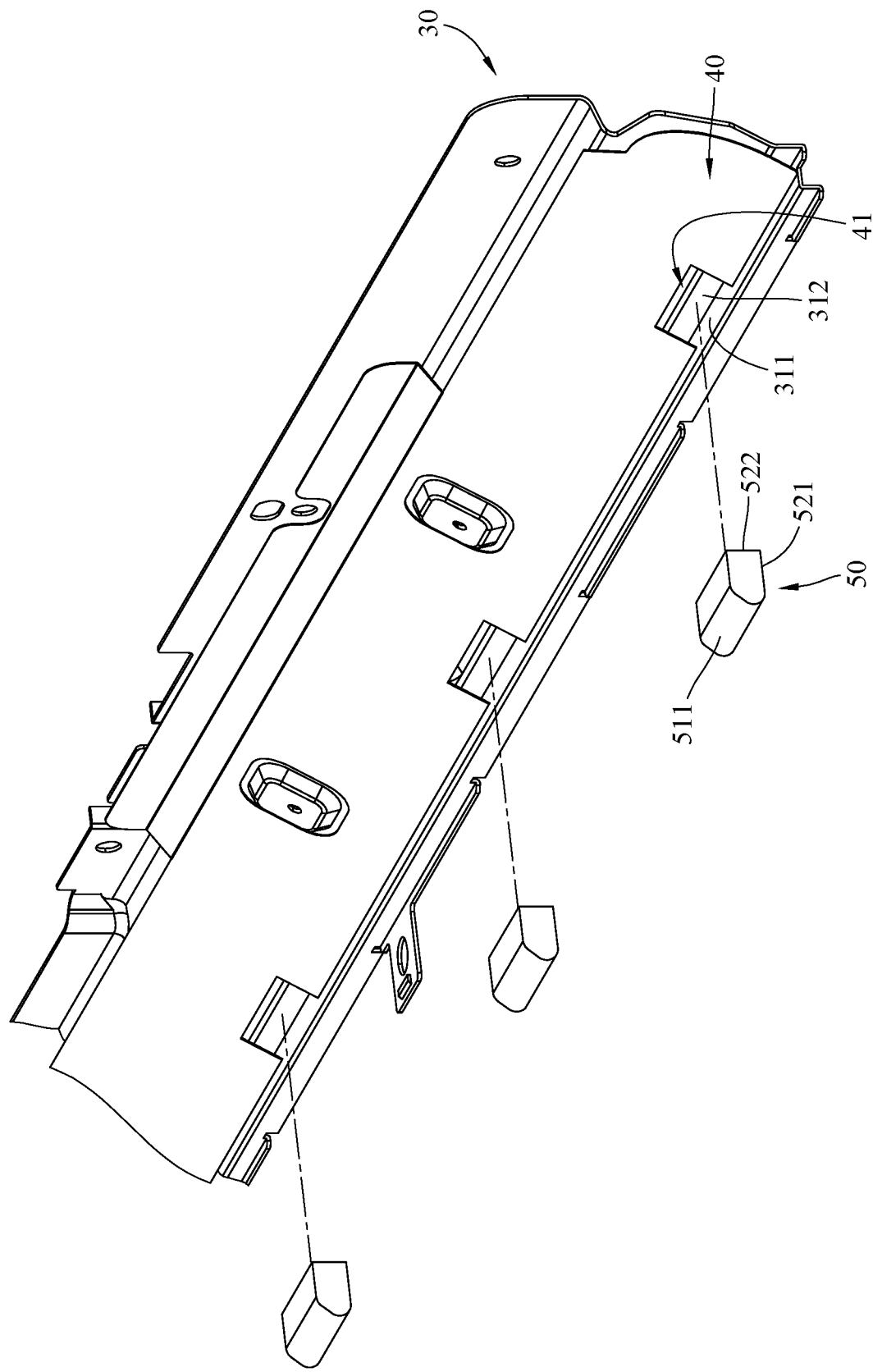
FIG. 11 shows that a step of installing the heat dissipation structure.

Then, as shown in FIG. 8 and FIG. 11, the step S300 is to install the heat dissipation structures 50 so as to thermally contact the heat dissipation structures 50 to the first bearing surface 311 and second bearing surface 312 of the thermal-conductive supporting component 30. The step S300 may further include a step of disposing the heat dissipation structures 50 through the notches 41 of the electrical insulation positioning sheet 40 so as to respectively thermally contact the second contact surface 521 and third contact surface 522 of the heat dissipation structure 50 to the first bearing surface 311 and second bearing surface 312 of the thermal-conductive supporting component 30. Additionally, as discussed above, in the case that the heat dissipation structure 50 is a self-adhesive block, the step of applying anti-stick coating on the first surface 511 of the heat dissipation structure 50 may be performed before the step S300.

Figure 5:
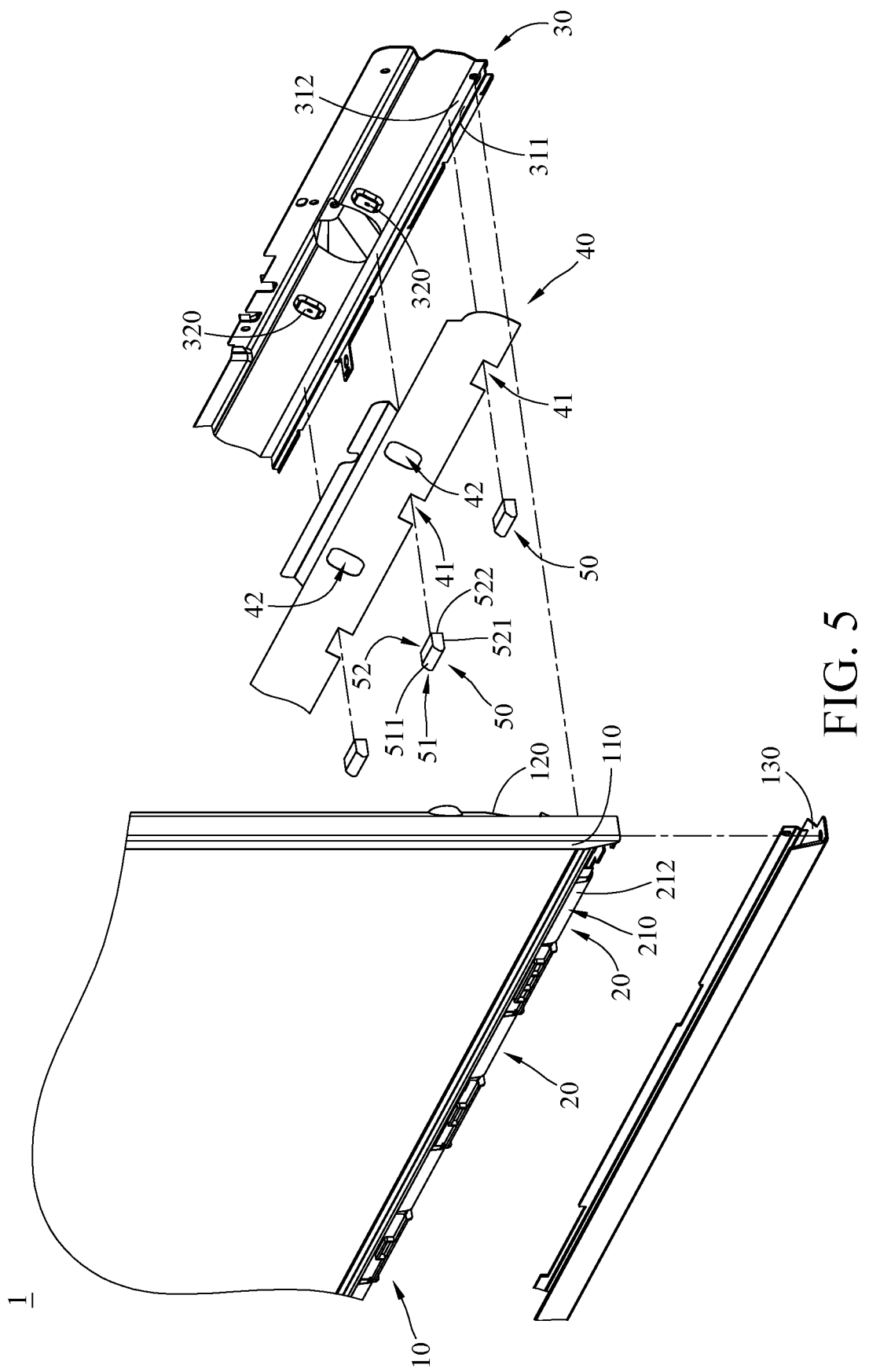
Figure 12:
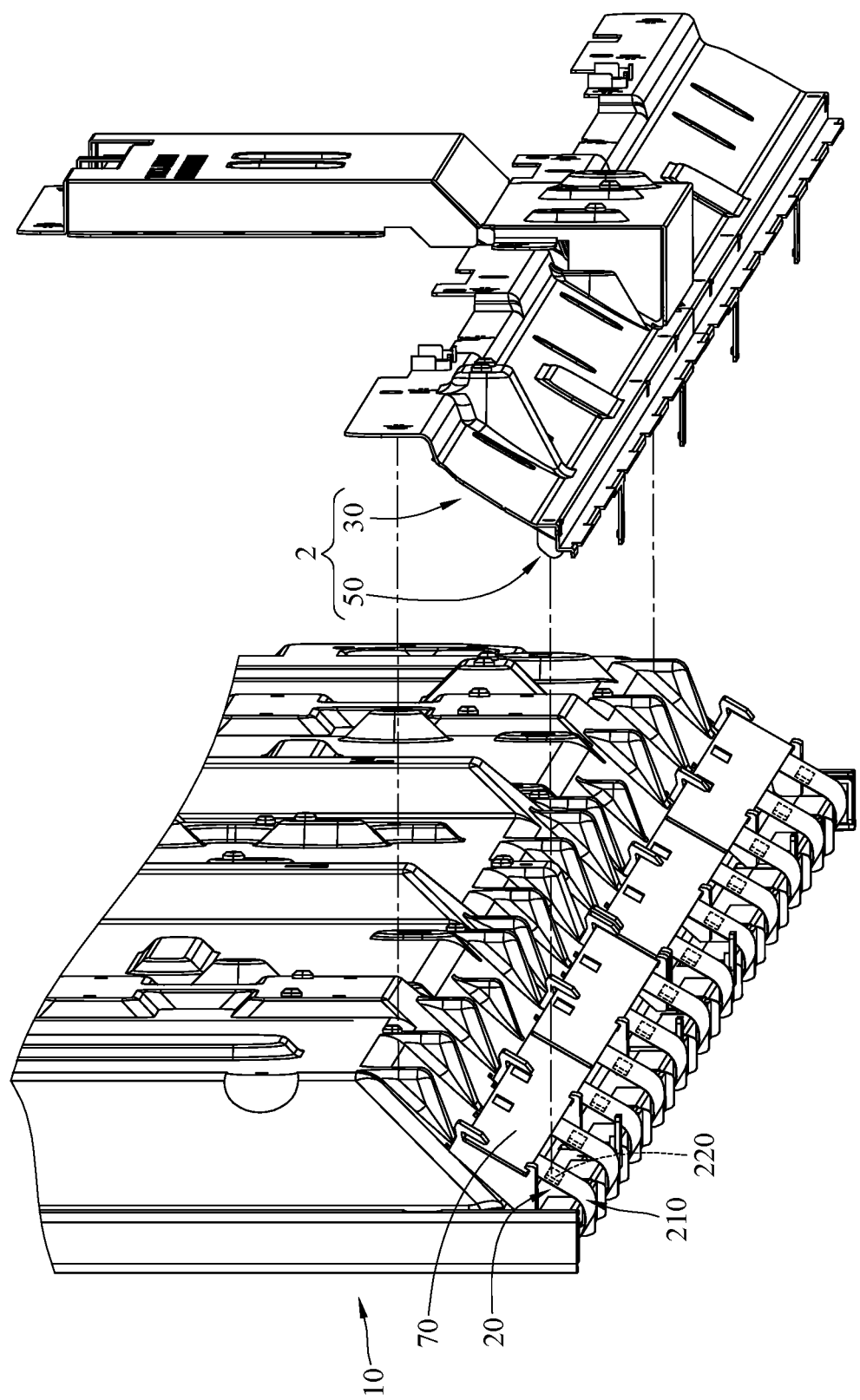
FIG. 12 shows that a step of installing the thermal-conductive supporting component.

Then, as shown in FIG. 8 and FIG. 12, the step S400 is to move the heat dissipation module 2 (the assembly of the thermal-conductive supporting component 30 and the heat dissipation structures 50) toward the display module 10 so as to install the thermal-conductive supporting component 30 on the display module 10 and to thermally contact the heat dissipation structures 50 to both the thermal-conductive supporting component 30 and the surfaces of the COFs 20 facing away from the chips 220. Lastly, the aforementioned bottom cover 130 (not shown in FIG. 12) may be installed to the bottom side of the display module 10 and screwed to the thermal-conductive supporting component 30, thereby completing the assembly of the display device 1. As discussed above, it is understood that the step (S300) of installing the heat dissipation structure and the step (S400) of installing the thermal-conductive supporting component can be considered as a step of installing the heat dissipation module 2. In addition, the step of installing the heat dissipation module 2 may further include a step of placing part of the electrical insulation positioning sheet 40 in between the thermal-conductive supporting component 30 and the circuit board 70 which is electrically connected to the flexible substrate 210 (as shown in FIG. 5).

Note that the order of the aforementioned steps is exemplary and can be changed according to actual requirements. For example, in other embodiments, the step S100 may be performed after the steps S200 and S300; alternatively, the step of applying the anti-stick coating on the first contact surface 511 of the heat dissipation structure 50 may be performed after the step S300.

Figure 13:
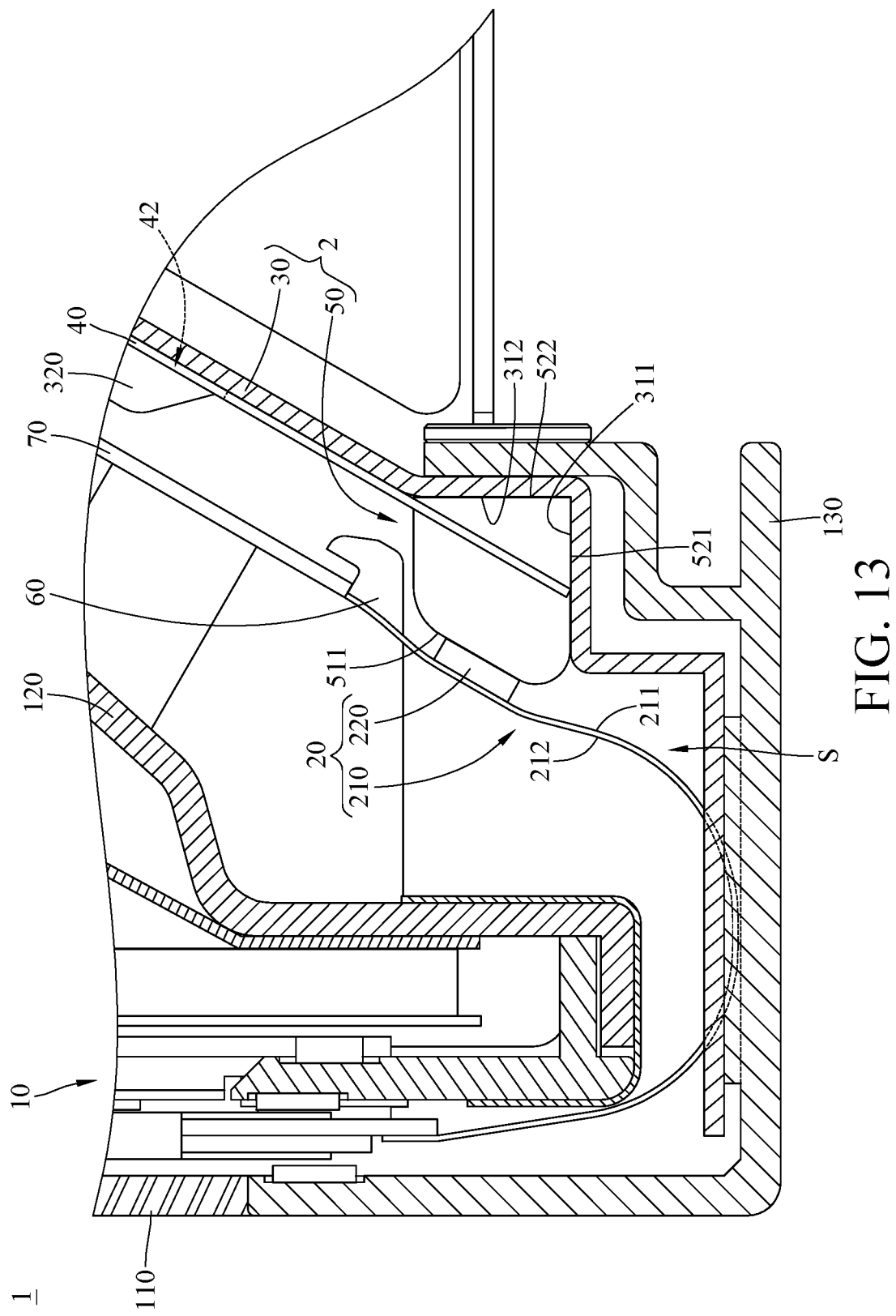
FIG. 13 is a partially enlarged cross-sectional view of a display device according to a second embodiment of the disclosure.

In the above embodiments, the heat dissipation structure is in thermal contact with the surface of the flexible substrate facing away from the chip of the COF, but the disclosure is not limited thereto. For example, please refer to FIG. 13, is a partially enlarged cross-sectional view of a display device according to a second embodiment of the disclosure. This embodiment provides a display device 1'. One of the main differences between the display device 1' and the display device 1 of the previous embodiments is that the orientation of the COF 20; thus the descriptions of the same components will not be repeated hereinafter.

In this embodiment, the first surface 211 of the flexible substrate 210 faces the heat dissipation structure 50 (faces away from the display module 10), such that the first contact surface 511 of the heat dissipation structure 50 thermally contacts and presses against the chip 220 of the COF 20. In such a case, the heat dissipation structure 50 can apply a force on the chip 220 of the COF 20 so as to slightly deform the flexible substrate 210. Therefore, through the chip 220, the heat dissipation structure 50 is still able to deform and thermally connect to the flexible substrate 210. Similarly, there is no gap between the first contact surface 511 of the heat dissipation structure 50 and the COF 20 and thus enhancing the thermal contact between the heat dissipation structure 50 and the COF 20. Note that the display device 1' can also be assembled by following the aforementioned assembly method.

Figure 14:
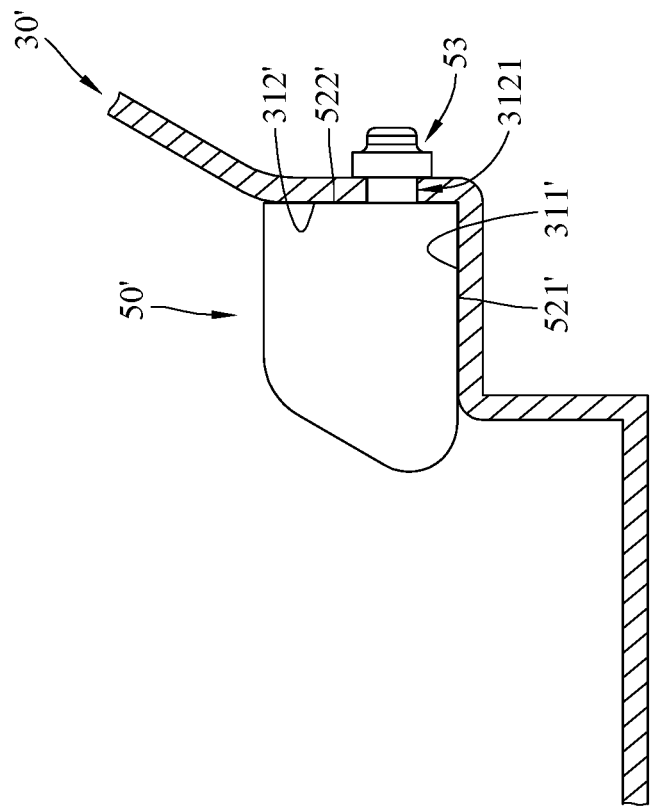
FIG. 14 is a partially enlarged cross-sectional exploded view of a heat dissipation structure and thermal-conductive supporting component according to a third embodiment of the disclosure.
Figure 15:
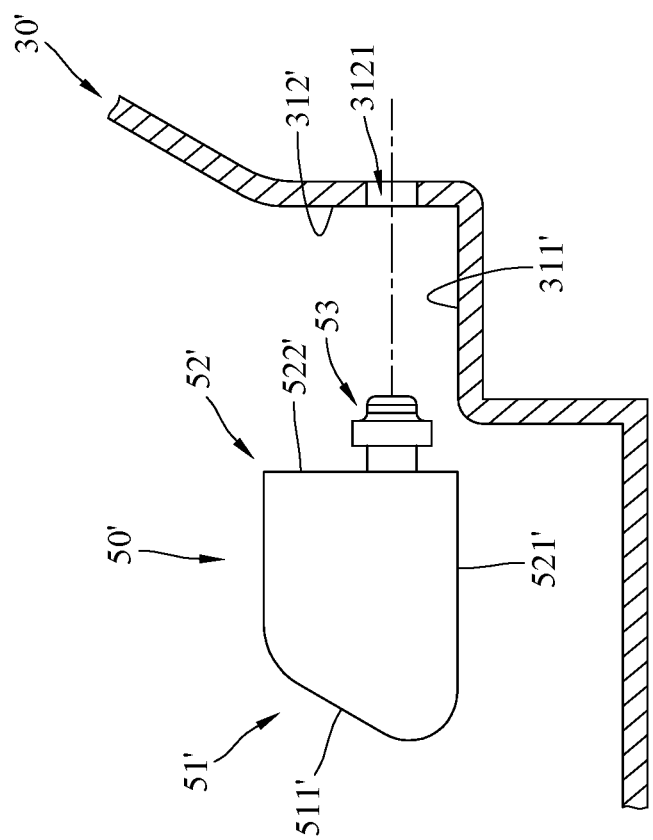
FIG. 15 is a partially enlarged cross-sectional view of the heat dissipation structure and thermal-conductive supporting component according to the third embodiment of the disclosure when the heat dissipation structure and thermal-conductive supporting component are assembled.

Moreover, in the disclosure, the heat dissipation structure may be fixed to the thermal-conductive supporting component via other structural features. For example, please refer to FIG. 14-15, FIG. 14 is a partially enlarged cross-sectional exploded view of a heat dissipation structure and thermal-conductive supporting component according to a third embodiment of the disclosure, and FIG. 15 is a partially enlarged cross-sectional view of the heat dissipation structure and thermal-conductive supporting component according to the third embodiment of the disclosure when the heat dissipation structure and thermal-conductive supporting component are assembled. This embodiment provides a heat dissipation structure 50' and a thermal-conductive supporting component 30', and the main difference between this and previous embodiments is that the heat dissipation structure 50' is fixed to the thermal-conductive supporting component 30' via one or more additional positioning portions thereon. Therefore, for the purpose of brief description, the following only describes the difference between this and previous embodiments, and the descriptions of the rest components that are similar or identical to that of the previous embodiments will not be repeated.

In this embodiment, the heat dissipation structure 50' has a first side 51' and a second side 52' opposite each other. In addition, the heat dissipation structure 50' may further includes a first contact surface 511', a second contact surface 521' and a third contact surface 522'. The first contact surface 511' is located on the first side 51', and the second contact surface 521' and third contact surface 522' are located on the second side 52'. In addition, the thermal-conductive supporting component 30' has a first bearing surface 311' and a second bearing surface 312'.

Further, in this embodiment, the heat dissipation structure 50' further has an engaging protrusion 53 protruding from the third contact surface 522'; and the thermal-conductive supporting component 30' further has an engaging hole 3121 located on the second bearing surface 312'. The heat dissipation structure 50' can be firmly fixed to the thermal-conductive supporting component 30' when the engaging protrusion 53 is engaged into the engaging hole 3121. In such a case, the material of the heat dissipation structure 50' may or may not be self-adhesive.

Further, in this embodiment, the step of installing the heat dissipation structure 50' to the thermal-conductive supporting component 30' is similar to the step S300 in the previous embodiment but may further include a step of engaging the engaging protrusion 53 of the heat dissipation structure 50' into the engaging hole 3121 of the thermal-conductive supporting component 30' while thermally contacting the second contact surface 521' and third contact surface 522' of the heat dissipation structure 50' to the first bearing surface 311' and second bearing surface 312' of the thermal-conductive supporting component 30'.

Additionally, please be noted that the locations of the engaging protrusion 53 and engaging hole 3121 are not restricted. In other embodiments, the engaging protrusion may be disposed on the second contact surface of the heat dissipation structure, and the engaging hole may be disposed on the first bearing surface of the thermal-conductive supporting component. Furthermore, the shapes and quantities of the engaging protrusion 53 and engaging hole 3121 are either not restricted and may be modified according to actual requirements.

According to the heat dissipation module, display device and assembly method discussed above, when the heat dissipation structure is in thermal contact with both the thermal-conductive supporting component and the flexible substrate, the heat dissipation structure can also press against and thus deforming the flexible substrate so as to enhance the thermal contact between the heat dissipation structure and the flexible substrate. Therefore, the heat dissipation structure can efficiently absorb the heat from the flexible substrate and transfer it to the thermal-conductive supporting component, thereby decreasing the temperature of the flexible substrate. As a result, the chip on the flexible substrate is avoided from operating at high temperature to deteriorate its performance and to result in thermal deformation or any other negative effects on the nearby components.

In addition, in some embodiments, there may be an electrical insulation positioning sheet disposed on the thermal-conductive supporting component to prevent the circuit board from contacting the thermal-conductive supporting component to cause a short-circuit and to protect the circuit board and the electrical components thereon from being hit by the thermal-conductive supporting component. Further, the notches on the electrical insulation positioning sheet help to position the heat dissipation structures.

Additionally, the heat dissipation structure may be highly thermally conductive, self-adhesive, not electrically conductive, flexible, and soft in texture. Therefore, the heat dissipation structure can be directly fixed to the thermal-conductive supporting component without additional adhesive. And the heat dissipation structure has a very low roughness and thus not easily scratching the flexible substrate.

Also, the material of the heat dissipation structure is cheaper than that of the conventional metallic heat dissipation structure; thus, the heat dissipation structure is also cost-effective.

Moreover, in some embodiments, the heat dissipation structure may be firmly fixed to the thermal-conductive supporting component by engaging the engaging protrusion into the engaging hole.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A heat dissipation module, configured to absorb heat from a flexible substrate, comprising:
   a thermal-conductive supporting component; and
   at least one heat dissipation structure, having a first side and a second side, wherein one side of the at least one heat dissipation structure is in thermal contact with the thermal-conductive supporting component via the second side, another side of the at least one heat dissipation structure is configured to be in thermal contact with the flexible substrate via the first side so as to force the flexible substrate to be deformed; wherein surfaces on the first side and the second side are not parallel to each other.

2. The heat dissipation module according to claim 1, wherein the flexible substrate has a first surface for a heat source to be mounted thereto, and the first surface faces away from the at least one heat dissipation structure.

3. The heat dissipation module according to claim 1, wherein the flexible substrate has a first surface for a heat source to be mounted thereto, and the first surface faces the at least one heat dissipation structure.

4. The heat dissipation module according to claim 1, wherein the at least one heat dissipation structure is self-adhesive.

5. The heat dissipation module according to claim 1, further comprising an anti-stick coating coated on the at least one heat dissipation structure and located between the flexible substrate and the at least one heat dissipation structure.

6. The heat dissipation module according to claim 1, wherein the at least one heat dissipation structure is made of electrical insulation material.

7. The heat dissipation module according to claim 1, wherein a material of the at least one heat dissipation structure at least comprises silicone resin and aluminum oxide.

8. A display device, comprising:
   a display module;
   at least one COF (chip-on-film), comprising a flexible substrate connected to the display module; and
   a heat dissipation module, comprising:
     a thermal-conductive supporting component, fixed to the display module; and
     at least one heat dissipation structure, having a first side and a second side, wherein one side of the at least one heat dissipation structure is in thermal contact with the thermal-conductive supporting component via the second side, and another side of the at least one heat dissipation structure is in thermal contact with the flexible substrate via the first side so as to force the flexible substrate to be deformed; wherein surfaces on the first side and the second side are not parallel to each other.

9. The display device according to claim 8, wherein the at least one COF further comprises a chip, the flexible substrate has a first surface, the chip is disposed on the first surface, and the first surface faces away from the at least one heat dissipation structure.

10. The display device according to claim 9, wherein at least part of the flexible substrate is clamped by the at least one heat dissipation structure and the chip.

11. The display device according to claim 8, wherein the at least one COF further comprises a chip, the flexible substrate has a first surface, the chip is disposed on the first surface, and the first surface faces the at least one heat dissipation structure.

12. The display device according to claim 8, wherein the at least one heat dissipation structure has an engaging protrusion, the thermal-conductive supporting component has a positioning hole, the engaging protrusion is configured to be engaged into the positioning hole so as to fixed the at least one heat dissipation structure to the thermal-conductive supporting component.

13. The display device according to claim 8, wherein the at least one heat dissipation structure is self-adhesive.

14. The display device according to claim 8, further comprising an anti-stick coating coated on the at least one heat dissipation structure and located between the flexible substrate and the at least one heat dissipation structure.

15. The display device according to claim 8, wherein the at least one heat dissipation structure is made of a single piece.

16. The display device according to claim 8, wherein the at least one heat dissipation structure is made of electrical insulation material.

17. The display device according to claim 8, wherein a material of the at least one heat dissipation structure at least comprises silicone resin and aluminum oxide.

18. The display device according to claim 8, wherein a hardness of the at least one heat dissipation structure is lower than or equal to a hardness of the flexible substrate of the at least one COF.

19. The display device according to claim 8, further comprising an electrical insulation positioning sheet disposed on a bearing surface of the thermal-conductive supporting component facing the display module, wherein the electrical insulation positioning sheet has at least one notch, part of the bearing surface is exposed from the at least one notch, the at least one heat dissipation structure is disposed through the at least one notch so as to thermally contact the bearing surface of the thermal-conductive supporting component.

20. The display device according to claim 19, further comprising a circuit board fixed to a side of the display module facing the thermal-conductive supporting component, two opposite ends of the flexible substrate of the at least one COF respectively electrically connected to the circuit board and the display module, wherein part of the electrical insulation positioning sheet is located between the circuit board and the thermal-conductive supporting component.

21. An assembly method, comprising:
providing a display module that is connected to at least one COF, wherein the at least one COF comprises a flexible substrate electrically connected to the display module;
disposing an electrical insulation positioning sheet on a thermal-conductive supporting component so that part of a bearing surface of the thermal-conductive supporting component is exposed from at least one notch of the electrical insulation positioning sheet;
disposing a side of at least one heat dissipation structure of a heat dissipation module through the at least one notch so that the at least one heat dissipation structure is in thermal contact with the bearing surface; and
moving the thermal-conductive supporting component and the at least one heat dissipation structure of the heat dissipation module toward the display module so as to install the thermal-conductive supporting component to the display module and to thermally contact another side of the at least one heat dissipation structure to the flexible substrate and thus deforming the flexible substrate.

* * * * *